（12）United States Patent
Iezumi et al.

(10) Patent No.: US 7,498,725 B2
(45) Date of Patent: Mar. 3, 2009

(54) PIEZOELECTRIC CERAMIC COMPOSITION AND LAMINATED PIEZOELECTRIC ELEMENT

(75) Inventors: Kumiko Iezumi, Tokyo (JP); Junichi Yamazaki, Tokyo (JP); Norimasa Sakamoto, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/944,768

(22) Filed: Nov. 26, 2007

(65) Prior Publication Data

US 2008/0129154 A1 Jun. 5, 2008

(30) Foreign Application Priority Data

Nov. 30, 2006 (JP) .............................. 2006-324769

(51) Int. Cl.
*H01L 41/083* (2006.01)

(52) U.S. Cl. .................. 310/358; 310/363; 252/62.9 R; 252/62.9 PZ

(58) Field of Classification Search ................. 310/358; 252/62.9 R, 62.9 PZ
See application file for complete search history.

(56) References Cited

U.S. PATENT DOCUMENTS 6,979,410 B2 * 12/2005 Sasaki .................. 252/62.9 PZ
7,045,075 B2 * 5/2006 Kasukawa et al. .... 252/62.9 PZ
7,408,292 B2 * 8/2008 Feltz et al. .................. 310/358
2008/0129155 A1 * 6/2008 Iezumi et al. ............... 310/358

FOREIGN PATENT DOCUMENTS

| DE | 19916380 A1 * | 10/1999 |
| JP | 2003-151811 A | 5/2003 |
| JP | 2004-137106 A | 5/2004 |
| JP | 2006-193414 A | 7/2006 |
| JP | 2007126344 A * | 5/2007 |
| JP | 2007230839 A * | 9/2007 |

* cited by examiner

*Primary Examiner*—Jaydi A San Martin
(74) *Attorney, Agent, or Firm*—Pearne & Gordon LLP

(57) ABSTRACT

A piezoelectric ceramic composition includes: a composite oxide, as a main component thereof, represented by the composition formula, $$Pb_a[(Zn_{1/3}Nb_{2/3})_xTi_yZr_z]O_3,$$

wherein a, x, y and z satisfy the following relations, $$0.96 \leq a \leq 1.03, 0.005 \leq x \leq 0.047, 0.42 \leq y \leq 0.53,$$
$$0.45 \leq z \leq 0.56, \text{ and } x+y+z=1;$$

and the following additives in the indicated percentages by mass in relation to the main component, Cu as a first additive, in a content α, in terms of $Cu_2O$, falling within a range $0 < \alpha \leq 0.5\%$;

at least one of Dy, Nd, Eu, Gd, Tb, Ho and Er, as a second additive, in a content β, in terms of oxide, falling within a range $0 < \beta \leq 0.3\%$;

and at least one of Ta, Nb, W and Sb, as a third additive, in a content γ, in terms of oxide, falling within a range $0 < \gamma \leq 0.6\%$.

3 Claims, 4 Drawing Sheets

↔ 60 μm

↔ 45 μm 0.5 μm

PIEZOELECTRIC CERAMIC COMPOSITION AND LAMINATED PIEZOELECTRIC ELEMENT

BACKGROUND OF THE INVENTION

1. Field of the Invention

The present invention relates to a piezoelectric ceramic composition suitable for the piezoelectric layers in various piezoelectric elements such as an actuator, a piezoelectric buzzer, a sound component and a sensor, and to a laminated piezoelectric element using the above-mentioned composition, and in particular, relates to a piezoelectric ceramic composition capable of being sintered at temperatures of 950° C. or lower and in a low-oxygen reductive atmosphere.

2. Description of the Related Art

Piezoelectric ceramic compositions to be used in such a piezoelectric element are required to be high in piezoelectric properties, in particular, large in piezoelectric strain constant. As piezoelectric ceramics capable of attaining a large piezoelectric strain constant, there have hitherto been known, for example, a ternary system (PZT) composed of lead titanate ($PbTiO_3$; PT), lead zirconate ($PbZrO_3$; PZ) and lead zincate niobate ($Pb(Zn_{1/3}Nb_{2/3})O_3$), or a piezoelectric ceramic in which the lead (Pb) in the above-mentioned ternary system is partially substituted with strontium (Sr), barium (Ba), calcium (Ca) or the like.

However, these conventional piezoelectric ceramics require high sintering temperatures of the order of 1200° C.; consequently, in the production of laminated piezoelectric elements, it is necessary to use, for internal electrodes, high-price noble metals such as platinum (Pt) and palladium (Pd), leading to a problem of increased cost. Accordingly, for the purpose of using a lower-price silver-palladium (Ag—Pd) alloy for internal electrodes, the sintering temperature has been demanded to be decreased.

Under these circumstances, the present applicants have proposed, in Japanese Patent Laid-Open No. 2004-137106, to enable low-temperature sintering at 1050° C. or lower by adding a first additive containing at least one selected from Fe, Co, Ni and Cu and a second additive containing at least one selected from Sb, Nb and Ta to the above-mentioned ternary piezoelectric ceramic compositions, and consequently to make usable low-price materials such as a Ag—Pd alloy for internal electrodes.

Recently, use of copper (Cu), lower in price than the Ag—Pd alloy, for internal electrodes has been investigated. Because the melting point of Cu is 1085° C., the use of Cu for internal electrodes requires the sintering temperature to be set at 1050° C. or lower. In this connection, it is to be noted that Cu starts to be sintered at a further lower temperature, so that the sintering temperature is required to be set at a temperature as low as possible, for example, at 950° C. or lower. Additionally, Cu is a base metal, and sintering of Cu in air leads to oxidation thereof to make Cu unusable as electrodes. Accordingly, preparation of laminated piezoelectric elements using Cu for internal electrodes requires the sintering to be carried out in a low-oxygen reductive atmosphere.

In response to the above-described requirement, the present applicants have proposed, in Japanese Patent Laid-Open No. 2006-193414, a production method of a piezoelectric ceramic in which Pb in a ratio of 0.01 to 1.5% by mass in terms of oxide (PbO) and Cu in a ratio of 1% by mass or less in terms of oxide (CuO) are added to a calcined powder having a composition represented by $(Pb_{a-b}Me_b)[(Zn_{1/3}Nb_{2/3})_xTi_yZr_z]O_3$ and then sintering is carried out, wherein a, b, x, y and z are the values respectively falling within the following ranges $0.96 \leqq a \leqq 1.03$, $0 \leqq b \leqq 0.1$, $0.05 \leqq x \leqq 0.40$, $0.1 \leqq y \leqq 0.5$ and $0.2 \leqq z \leqq 0.6$ with the proviso that $x+y+z=1$, and Me represents at least one element selected from the group consisting of strontium (Sr), calcium (Ca) and barium (Ba).

SUMMARY OF THE INVENTION

In Japanese Patent Laid-Open No. 2006-193414, it has been verified that even a low sintering temperature and even a sintering in a low-oxygen reductive atmosphere attain high piezoelectric properties.

However, according to the investigation performed thereafter by the present inventors, the piezoelectric ceramic composition of Japanese Patent Laid-Open No. 2006-193414 exhibits excellent piezoelectric properties at low applied voltages of, for example, 1 V/mm or lower, but no sufficient displacements have been obtained in products such as actuators required to be driven at high voltages. Because these products are to be driven at high voltages of 1 to 3 kV/mm, piezoelectric ceramics are also required to exhibit satisfactory piezoelectric properties at such high voltages. Among a plurality of physical property values to evaluate the piezoelectric properties, significant are the electromechanical coupling factor kr (%) and the displacement magnitude when the piezoelectric ceramic composition is used for a laminated piezoelectric element. Because it is cumbersome to evaluate materials at such high voltages of 1 kV/mm or higher, actually a simple impedance measurement and a simple measurement with a d33 meter are carried out at a low voltage (1 V/mm or lower). By assuming that the piezoelectric properties at a low voltage and the piezoelectric properties at a high voltage link with each other, evaluation of the piezoelectric ceramic compositions has hitherto been carried out. However, for the piezoelectric ceramic composition disclosed in Japanese Patent Laid-Open No. 2006-193414, it has been found that the piezoelectric properties at a low voltage do not link with the piezoelectric properties at a high voltage.

Accordingly, the present invention takes as its object the provision of a piezoelectric ceramic composition and a laminated piezoelectric element capable of being sintered at low temperatures and in a low-oxygen reductive atmosphere, and capable of attaining sufficient displacements at high voltages of 1 kV/mm or higher.

The present inventors have investigated the PZT composition and have found that, in the composition represented by $(Pb_{a-b}Me_b)[(Zn_{1/3}Nb_{2/3})_xTi_yZr_z]O_3$, the piezoelectric properties at high voltages are varied by x representing the substitution amount of $(Zn_{1/3}Nb_{2/3})$ referred to as a relaxer. More specifically, with the decrease of x, the piezoelectric properties at high voltages of 1 kV/mm or higher have been found to be improved. However, the decrease of x, namely, the decrease of the relaxer component amount increases the sintering temperature for giving a sufficient density to be as high as 1100° C. or higher, and hence it is impossible to obtain laminated piezoelectric elements at low sintering temperatures.

For this problem of sintering temperature, addition of Cu has been verified to give dense ceramics at low sintering temperatures. However, there has been revealed a problem that addition of Cu causes degradation of the piezoelectric properties at high voltages. According to the further study by the present inventors, for the purpose of attaining high piezoelectric properties at high voltages while enjoying the sintering temperature decreasing effect due to addition of Cu, it has been found effective to add at least one selected from Dy, Nd, Eu, Gd, Tb, Ho and Er, and further at least one selected from Ta, Nb, W and Sb.

The piezoelectric ceramic composition of the present invention based on the above-described findings includes:

a composite oxide, as a main component thereof, represented by the following composition formula (1) or (2);

Cu as a first additive, in a content $\alpha$, in terms of $Cu_2O$, falling within a range $0<\alpha\leq0.5\%$ by mass in relation to the main component;

at least one selected from Dy, Nd, Eu, Gd, Tb, Ho and Er, as a second additive, in a content $\beta$, in terms of oxide, falling within a range $0<\beta\leq0.3\%$ by mass, in relation to the main component; and at least one selected from Ta, Nb, W and Sb, as a third additive, in a content $\gamma$, in terms of oxide, falling within a range $0<\gamma\leq0.6\%$ by mass, in relation to the main component; wherein:

$$Pb_a[(Zn_{1/3}Nb_{2/3})_xTi_yZr_z]O_3, \quad \text{composition formula (1):}$$

a, x, y and z in the composition formula (1) satisfying the following relations, $0.96\leq a\leq1.03$, $0.005\leq x\leq0.047$, $0.42\leq y\leq0.53$, $0.45\leq z\leq0.56$, and $x+y+z=1$; and $$(Pb_{a-b}Me_b)[(Zn_{1/3}Nb_{2/3})_xTi_yZr_z]O_3, \quad \text{composition formula (2):}$$

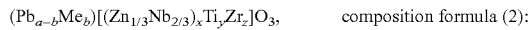

a, b, x, y and z in the composition formula (2) satisfying the following relations, $0.96\leq a\leq1.03$, $0<b\leq0.1$, $0.005\leq x\leq0.047$, $0.42\leq y\leq0.53$, $0.45\leq z\leq0.56$, and $x+y+z=1$, and Me in the composition formula (2) representing at least one selected from Sr, Ca and Ba.

The above-described piezoelectric ceramic composition of the present invention is different from the piezoelectric ceramic compositions disclosed in Japanese Patent Laid-Open Nos. 2004-137106 and 2006-193414 in the amount of the relaxer component as x in such a way that the x value in each of the above composition formulas is 0.047 or less and the corresponding x values in Japanese Patent Laid-Open Nos. 2004-137106 and 2006-193414 are 0.05 or more. This is because such a decrease of the relaxer component amount so as to be 0.047 or less permits attaining high piezoelectric properties at high voltages.

Here, it is to be noted that Cu forms a eutectic crystal with Pb that is a main constituent element of the piezoelectric ceramic composition, in the vicinity of 963° C. Consequently, when a laminated piezoelectric element is prepared by using Cu as a material for the internal electrodes, the piezoelectric ceramic composition is required to be a material capable of being sintered at 950° C. or lower. Additionally, sintering of Cu in air leads to oxidation thereof, so that the sintering is required to be carried out in a low-oxygen reductive atmosphere. In this context, the piezoelectric ceramic composition according to the present invention permits obtaining a dense sintered body even by sintering in a low-oxygen reductive atmosphere.

The present invention can be applied to a laminated piezoelectric element. In other words, the present invention provides a laminated piezoelectric element including a plurality of piezoelectric layers and a plurality of internal electrodes interposed between the piezoelectric layers, wherein the piezoelectric layers are formed of the above-described piezoelectric ceramic composition. In this laminated piezoelectric element, the internal electrodes can be formed of Cu. This is because the piezoelectric ceramic composition of the present invention is capable of being sintered at low temperatures and in a low-oxygen reductive atmosphere. However, the laminated piezoelectric element of the present invention is not limited to the adoption of internal electrodes formed of Cu, but permits, needless to say, the conventional use of Pt, Pd and a Ag—Pd alloy for internal electrodes, and also allows the use of low-price nickel (Ni) and other metals (inclusive of alloys) for the internal electrodes.

As described above, according to the present invention, the sintering can be carried out at low temperatures of 950° C. or lower and in a low-oxygen reductive atmosphere, and sufficient displacement can be obtained even at high voltages of 1 kV/mm or higher.

DETAILED DESCRIPTION OF THE PREFERRED EMBODIMENTS

Figure 1:
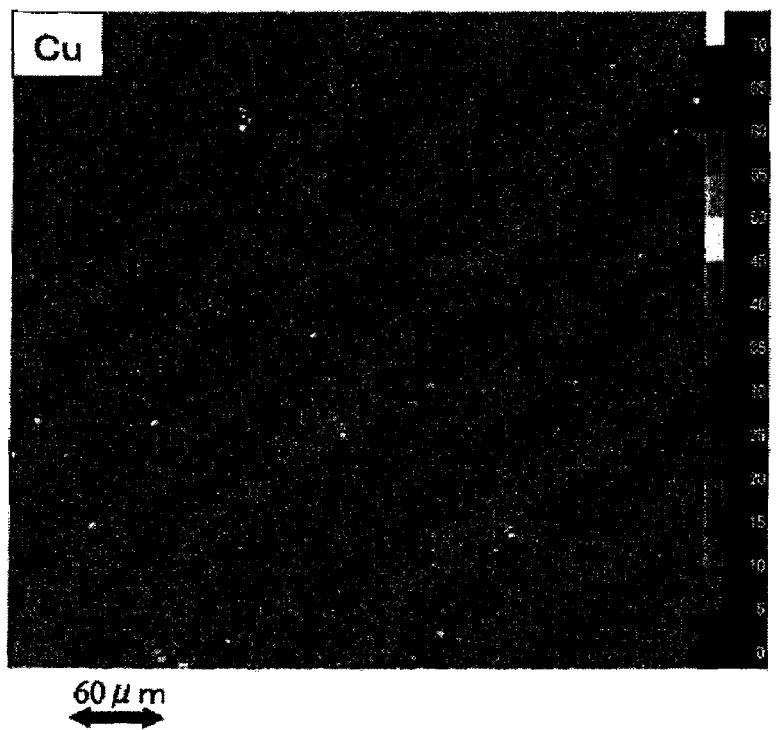
FIG. 1 is an EPMA (Electron Probe Micro Analyzer) element mapping image of a sintered body obtained by printing a Cu paste.

The piezoelectric ceramic composition according to the present invention includes the composite oxide, as a main component thereof, represented by the following composition formula (1) or (2):

$$Pb_a[(Zn_{1/3}Nb_{2/3})_xTi_yZr_z]O_3, \quad \text{composition formula (1):}$$

a, x, y and z in the composition formula (1) satisfying the following relations, $0.96\leq a\leq1.03$, $0.005\leq x\leq0.047$, $0.42\leq y\leq0.53$, $0.45\leq z\leq0.56$, and $x+y+z=1$; and $$(Pb_{a-b}Me_b)[(Zn_{1/3}Nb_{2/3})_xTi_yZr_z]O_3, \quad \text{composition formula (2):}$$

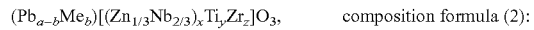

a, b, x, y and z in the composition formula (2) satisfying the following relations, $0.96\leq a\leq1.03$, $0<b\leq0.1$, $0.005\leq x\leq0.047$, $0.42\leq y\leq0.53$, $0.45\leq z\leq0.56$, and $x+y+z=1$, and Me in the composition formula (2) representing at least one selected from Sr, Ca and Ba.

The above-mentioned composite oxide has a so-called perovskite structure, wherein Pb and the substitutional element Me for Pb are located at the so-called A-site in the perovskite structure, and Zn, Nb, Ti and Zr are located at the so-called B-site in the perovskite structure.

In the above composition formulas, the ratio a of Pb as an A-site element or the total ratio a of Pb and Me as A-site elements preferably satisfies $0.96\leq a\leq1.03$. When the A-site element ratio a is less than 0.96, sintering at low temperatures becomes difficult. On the other hand, when the A-site element ratio a exceeds 1.03, the piezoelectric properties at high voltages are degraded. The A-site element ratio a more preferably satisfies $0.97\leq a\leq1.02$, and furthermore preferably satisfies $0.98\leq a\leq1.01$.

The present invention allows a partial substitution of Pb in the above composition formula with the element Me (Sr, Ca, Ba). By this substitution, the piezoelectric strain constant can be increased. However, when the substitution ratio b of the substitutional element Me becomes too large, the piezoelectric properties at high voltages are degraded. Additionally, the Curie temperature also tends to be decreased with the increase of the substitution ratio b. Consequently, the substitution ratio b of the substitutional element Me is preferably set at 0.1 or less, more preferably set to satisfy $0.005 \leq b \leq 0.08$, and furthermore preferably set to satisfy $0.007 \leq b \leq 0.05$. It is to be noted that when Pb is partially substituted with Me, the ratio of Pb is (a−b).

Among the ratios of the B-site elements, the ratio x of Zn and Nb as the relaxer component satisfies $0.005 \leq x \leq 0.047$. According to the investigation performed by the present inventors, the piezoelectric properties at high voltages tend to be increasingly improved with the decrease of the x value. Accordingly, the present invention sets x to be 0.047 or less. However, when the ratio of the relaxer component is less than 0.005, the piezoelectric properties at high voltages are remarkably degraded. Consequently, the ratio x of Zn and Nb preferably satisfies $0.01 \leq x \leq 0.04$, and more preferably $0.015 \leq x \leq 0.025$.

It is to be noted that Japanese Patent Laid-Open Nos. 2004-137106 and 2006-193414 include no description suggesting that the decrease of the relaxer component amount improves piezoelectric properties at high voltages.

Among the ratios of the B-site elements, the preferable ranges for the ratio y of Ti and the ratio z of Zr are set from the viewpoint of the piezoelectric properties. Specifically, the ratio y of Ti is preferably set to satisfy $0.42 \leq y \leq 0.53$, and the ratio z of Zr is preferably set to satisfy $0.45 \leq z \leq 0.56$. By setting these ratios to fall within the above-mentioned ranges, there can be obtained a large piezoelectric strain constant in the vicinity of the morphotropic phase boundary (MPB).

The ratio y of Ti more preferably satisfies $0.45 \leq y \leq 0.49$, and furthermore preferably $0.45 \leq y \leq 0.48$.

The ratio z of Zr more preferably satisfies $0.46 \leq z \leq 0.55$, and furthermore preferably $0.48 \leq z \leq 0.54$.

It is to be noted that the composition of each element, for example, oxygen (O) in the above composition formulas is derived stoichiometrically; in the ceramics actually obtained by sintering, such compositions sometimes deviate from the stoichiometric compositions; in this connection, ceramics undergoing such deviations are also to be included in the present invention.

The piezoelectric ceramic composition of the present invention includes Cu as the first additive, in a content of α, in terms of $Cu_2O$, falling within a range $0 < \alpha \leq 0.5\%$ by mass.

In the piezoelectric ceramic composition of the present invention, for the purpose of ensuring the piezoelectric properties at high voltages, the ratio x of the relaxer component (Zn and Nb) at the B-site is set at a low value. However, such a ratio setting necessitates an increase of the sintering temperature for the purpose of attaining a sufficient sintering density, so that the low-temperature sintering at 950° C. or lower can not be actualized. The present invention enables a dense sintering even when sintered at 950° C. or lower by including Cu as described above. However, when the content of Cu exceeds 0.5% by mass in terms of $Cu_2O$, the piezoelectric properties at high voltages are remarkably degraded, and consequently the below-described effect of the second additive can not be enjoyed. Accordingly, the upper limit of the content Cu in terms of $Cu_2O$ is set at 0.5% by mass. The content of Cu preferably satisfies $0.01 \leq \alpha \leq 0.2\%$ by mass and more preferably $0.01 \leq \alpha \leq 0.1\%$ by mass.

The content of Cu is specified in terms of $Cu_2O$ as described above. However, this does not intend to specify the form of presence of Cu in the piezoelectric ceramic composition. For example, in the piezoelectric ceramic composition, Cu may be included as the Cu oxides having arbitrary oxidation states such as $Cu_2O$ and CuO, or may be present as metallic Cu.

Additionally, the Cu contained in the piezoelectric ceramic composition may be based on the addition of Cu as $Cu_2O$ in a precursor, may be based on the partial diffusion, during sintering, of the Cu contained in the internal electrodes to be described below into the piezoelectric layers, or may be based on a combination of the above-mentioned addition and diffusion. In the present invention, it is essential that Cu is contained in the piezoelectric ceramic composition, but fundamentally the way of addition thereof or the form of presence thereof is insignificant. It is to be noted that the Cu based on the addition and the Cu based on the diffusion are different from each other in the form of presence in the piezoelectric layers as described below.

By using a below-described raw material powder of the main component of Example 1, a disc-shaped compacted body was obtained in the same manner as in Example 1. A Cu-paste containing a Cu-powder having a particle size of 1.0 μm was printed on both sides of this compacted body. Then, the compacted body was heat-treated to evaporate the binder and sintered in a low-oxygen reductive atmosphere (oxygen partial pressure: $1 \times 10^{-10}$ to $1 \times 10^{-6}$ atm) at 950° C. for 8 hours.

Additionally, another disc-shaped compacted body was obtained in the same manner as in Example 1 except that a $Cu_2O$ powder was added in a content of 0.05% by mass to the below-described raw material powder of the main component of Example 1. Then, the compacted body was sintered in the same manner as described above.

Figure 2:
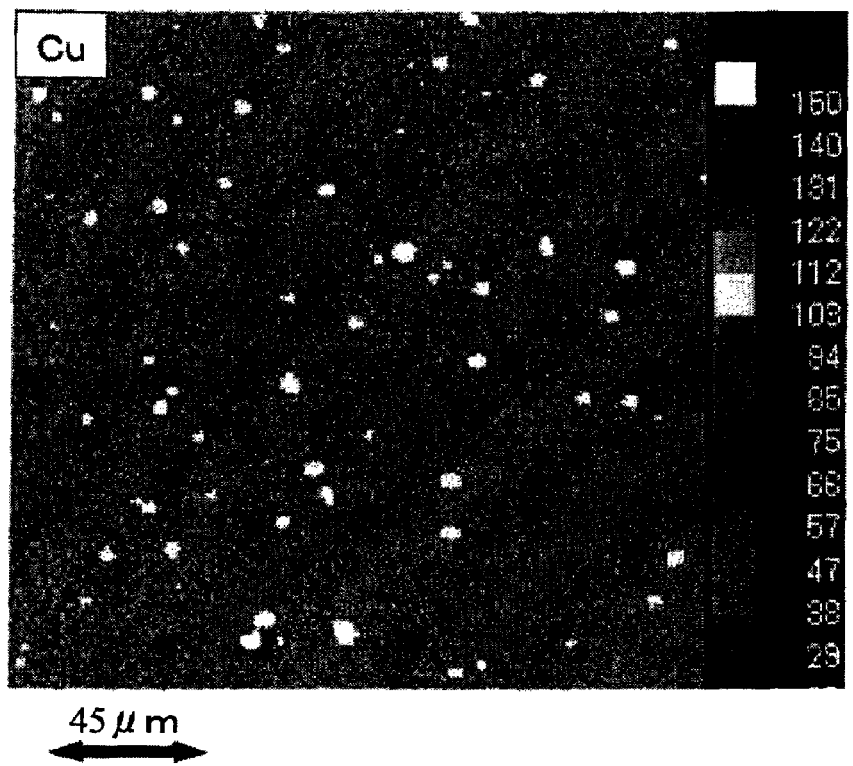
FIG. 2 is an EPMA element mapping image of a sintered body obtained by adding a $Cu_2O$ powder.
Figure 3:
FIG. 3 is a TEM image of the sintered body obtained by adding a $Cu_2O$ powder.

The two sintered bodies obtained as described above were subjected to the element (Cu) mapping based on EPMA (Electron Probe Micro Analyzer). The results thus obtained are shown in FIG. 1 (based on Cu-paste printing) and FIG. 2 (based on addition of a $Cu_2O$ powder). As shown in FIGS. 1 and 2, the segregation of Cu was remarkably observed in the sintered body with the $Cu_2O$ powder added thereto as compared to the sintered body obtained by printing the Cu-paste. It is to be noted that the portions paler in color correspond to the portions higher in the concentration of Cu. For the purpose of verifying the real identity of the segregation of Cu, the sintered body with the $Cu_2O$ powder added thereto was subjected to a TEM (Transmission Electron Microscope) observation; specifically, the compositions of the points A to F shown in FIG. 3 were analyzed. Consequently, the content of $Cu_2O$ at the position of the point F was identified to be 93.6% by mass. Therefore, the particles located at the position including the point F are interpreted to be based on the added $Cu_2O$ powder. On the other hand, the sintered body obtained by printing the Cu-paste was also subjected to the TEM observation; consequently, no particles containing a large amount of $Cu_2O$ were able to be found, and Cu was identified to be present in the grain boundary between the grains in the sintered body. Owing to the presence of Cu exclusively in the grain boundary phase instead of the presence of Cu as grains, the durability of the piezoelectric properties is improved as shown in below-described Example 8.

The piezoelectric ceramic composition of the present invention includes, as a second additive, at least one selected from Dy, Nd, Eu, Gd, Tb, Ho and Er. The second additive provides an effect to prevent the degradation of the piezoelectric properties at high voltages caused by inclusion of the first additive. However, the content β, in terms of oxide, of these second additives is set to satisfy $0 < \beta \leq 0.3\%$ by mass in relation to the main component. This is because when the content of the second additive exceeds 0.3% by mass in terms of oxide, the piezoelectric properties at high voltages are degraded. For the purpose of deriving the contents in terms of oxide, $Dy_2O_3$ is adopted for Dy, $Nd_2O_3$ is adopted for Nd, $Eu_2O_3$ is adopted for Eu, $Gd_2O_3$ is adopted for Gd, $Tb_2O_3$ is adopted for Tb, $Ho_2O_3$ is adopted for Ho and $Er_2O_3$ is adopted for Er. It is to be noted that the second additive is an essential element, and the description that the content is 0.3% by mass or less means that the content of 0% by mass is not included.

The content of the second additive preferably satisfies $0.01 \leq \beta \leq 0.15\%$ by mass and more preferably $0.02 \leq \beta \leq 0.1\%$ by mass.

The piezoelectric ceramic composition of the present invention includes, as a third additive, at least one selected from Ta, Nb, W and Sb. The addition of the third additive can improve the piezoelectric properties. The content γ, in terms of oxide, of these third additives is set to satisfy $0 < \gamma \leq 0.6\%$ by mass in relation to the main component. This is because when the content of the third additive exceeds 0.6% by mass in terms of oxide, there is a fear that the sinterability is degraded and the piezoelectric properties are degraded. For the purpose of deriving the contents in terms of oxide, $Ta_2O_5$ is adopted for Ta, $Nb_2O_5$ is adopted for Nb, $WO_3$ is adopted for W and $Sb_2O_3$ is adopted for Sb.

The content of the third additive preferably satisfies $0.05 \leq \gamma \leq 0.4\%$ by mass and more preferably $0.1 \leq \gamma \leq 0.35\%$ by mass.

When trivalent Dy enters into the divalent A-sites, Dy serves as a donor and improves the properties of the piezoelectric ceramic composition.

A third additive such as W is hexavalent and is an element that is larger in valency than the tetravalent B-site and is generally called a donor.

An element larger in valency such as W undergoes larger binding force from other elements, so that such an element is slow in the migration (diffusion) during sintering and leads to a fear that such an element degrades the sinterability. However, such an element undergoing larger binding force from other elements is understood to soften the piezoelectric effect so as to improve the intrinsic piezoelectric properties. Other third additives are pentavalent or hexavalent, and accordingly attain similar effects.

Following the above description on the piezoelectric ceramic composition according to the present invention, description will be made on the laminated piezoelectric element to which the piezoelectric ceramic composition of the present invention is applied.

Figure 4:
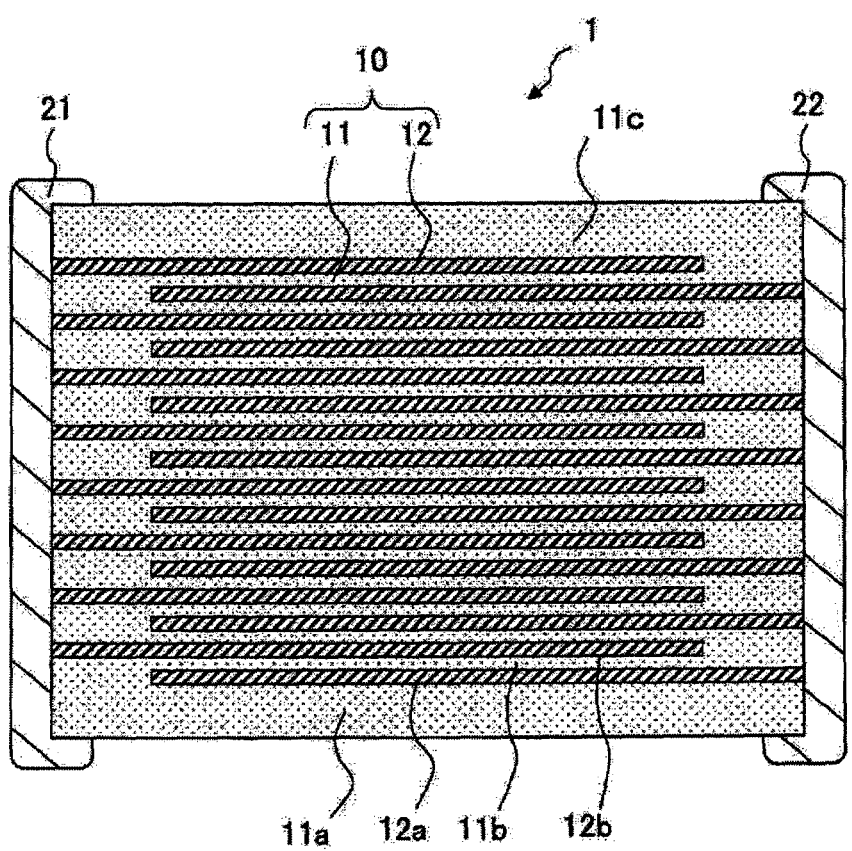
FIG. 4 is a view illustrating a construction example of a laminated piezoelectric element in an embodiment of the present invention.

FIG. 4 is a cross-sectional view illustrating a construction example of the laminated piezoelectric element 1 obtained according to the present invention. It is to be noted that FIG. 4 shows one example, and needless to say, the present invention is not limited to the laminated piezoelectric element 1 shown in FIG. 4. The laminated piezoelectric element 1 has a laminate 10 in which a plurality of piezoelectric layers 11 and a plurality of internal electrodes 12 are alternately laminated with each other. The thickness of one piezoelectric layer 11 is set, for example, at 1 to 200 μm, preferably at 20 to 150 μm, and more preferably at 50 to 100 μm. The lamination number of the piezoelectric layers 11 is determined according to the targeted displacement magnitude.

As the piezoelectric ceramic composition forming the piezoelectric layers 11, the above-described piezoelectric ceramic composition according to the present invention is used. The piezoelectric layers 11 contain as a main component thereof a composite oxide represented by the above composition formula (1) or (2), and can actualize, through containing the first to third additives, high piezoelectric properties at high voltages even when sintered at low temperatures of 950° C. or lower and in a low-oxygen reductive atmosphere.

The internal electrodes 12 contain a conductive material. The piezoelectric ceramic composition according to the present invention is capable of being sintered at low temperatures of 1050° C. or lower, and further 950° C. or lower, and hence there can be used as a conductive material, needless to say, an Ag—Pd alloy, and Cu and Ni. As described above, when Cu is used as the conductive material for the internal electrodes 12, it is required that the sintering can be carried out at 950° C. or lower and in a low-oxygen reductive atmosphere; the piezoelectric ceramic composition according to the present invention satisfies both of these conditions.

The plurality of internal electrodes 12 are, for example, alternately extended in opposite directions, and a pair of terminal electrodes 21 and 22 are disposed to be electrically connected to the alternate extension ends of the internal electrodes 12, respectively. The terminal electrodes 21 and 22 are, for example, electrically connected to an external power supply not shown in the figure through the lead wires not shown in the figure.

The terminal electrodes 21 and 22 may be formed, for example, by sputtering with Cu, or alternatively, by baking a paste for the terminal electrodes. The thickness of each of the terminal electrodes 21 and 22 is appropriately determined according to the intended purposes, and is usually 10 to 50 μm.

Figure 5:
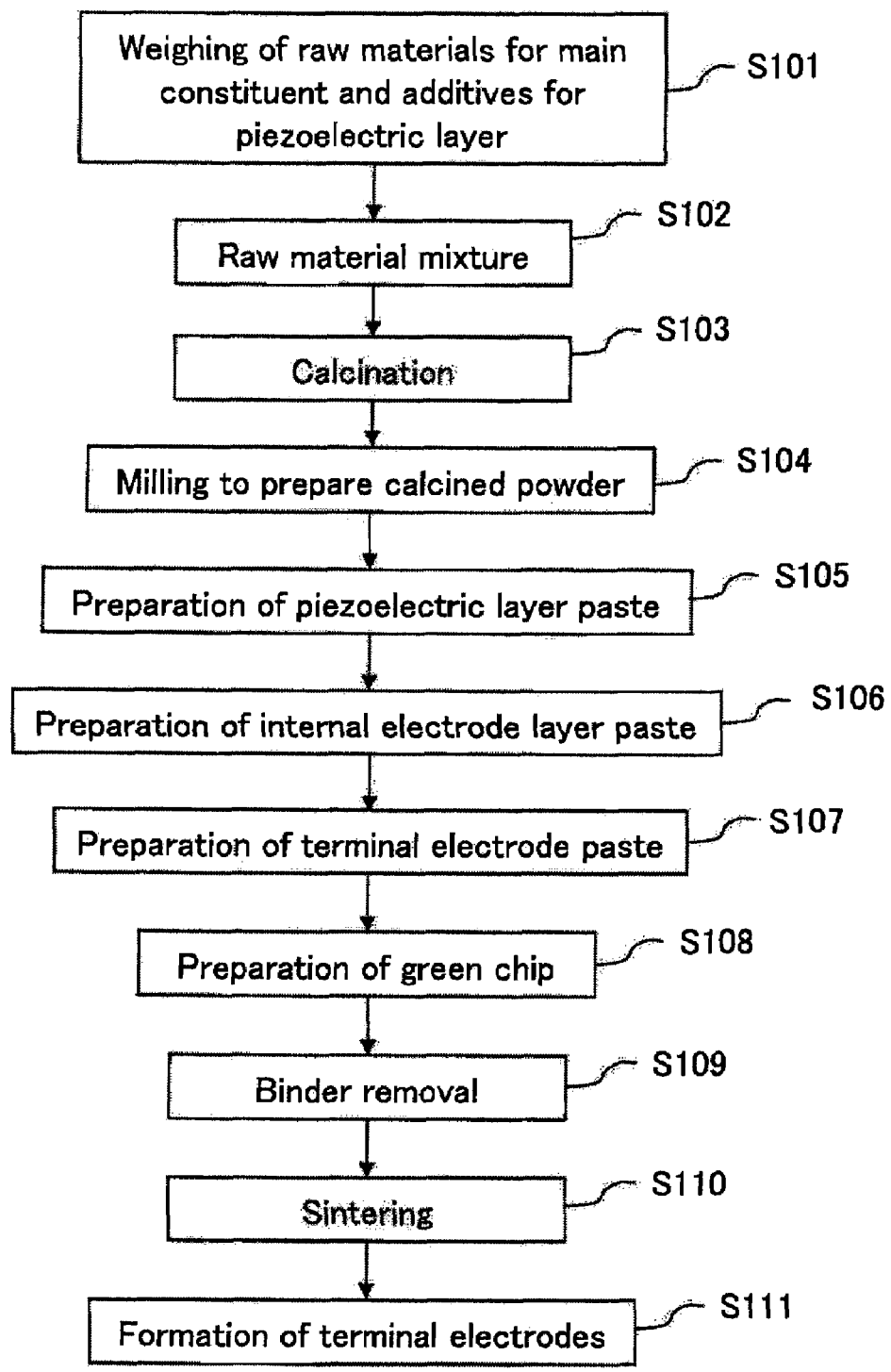
FIG. 5 is a flow chart showing production procedures of the laminated piezoelectric element in the embodiment of the present invention.

Next, description will be made on a preferable production method of the laminated piezoelectric element 1 with reference to FIG. 5. FIG. 5 is a flow chart showing a production process of the laminated piezoelectric element 1.

First, as the starting materials for the main component for obtaining the piezoelectric layers 11, for example, the following are prepared and weighed out (step S101): powders of PbO, $TiO_2$, $ZrO_2$, ZnO and $Nb_2O_5$, or compounds that can be converted into these oxides by sintering; and a powder of at least one oxide selected from SrO, BaO and CaO or at least one selected from the compounds that can be converted into these oxides by sintering. As the starting materials, instead of oxides, compounds such as carbonates and oxalates that are converted into oxides by sintering may also be used. Such raw material powders having a mean particle size of approximately 0.5 to 10 μm are usually used.

When the additives are mixed with the starting materials for the piezoelectric layers 11, raw materials for the individual additives are prepared in addition to the above-mentioned starting materials. As the first additive, at least one of a Cu powder, a $Cu_2O$ powder and a CuO powder can be used. As the second additive, at least one of a $Dy_2O_3$ powder, a $Nd_2O_3$ powder, a $Eu_2O_3$ powder, a $Gd_2O_3$ powder, a $Tb_2O_3$ powder, a $Ho_2O_3$ powder and a $Er_2O_3$ powder can be used. Additionally, as the third additive, at least one of a $Ta_2O_5$ powder, a $Nb_2O_5$ powder, a $WO_3$ powder and a $Sb_2O_3$ powder can be used. As described above, instead of oxides, compounds such as carbonates and oxalates that are converted into oxides by sintering may also be used.

Subsequently, the starting materials for the main component and the additives are wet milled and mixed, for example, with a ball mill to yield the raw material mixture (step S102).

The starting materials for the additives may be added before the calcination (step S103) to be described below, or may be designed to be added after the calcination. It is to be noted that the addition of the additives before the calcination is preferable because more homogeneous piezoelectric layers 11 can thereby be formed; when added after calcination, oxides are preferably used for the starting materials for the additives.

Next, the raw material mixture is dried and calcined, for example, at temperatures of 750 to 950° C. for 1 to 6 hours (step S103). This calcination may be carried out in air, in an atmosphere having an oxygen partial pressure higher than that in air, or in an atmosphere of pure oxygen.

After calcination, the calcined mixture is wet milled and mixed, for example, with a ball mill to yield a calcined powder containing the main component and additives according to the needs (step S104).

Next, the calcined powder is added with a binder to prepare a piezoelectric layer paste (step S105). Specifically, the involved procedures are as follows: first, for example, with a ball mill, a slurry is prepared by wet milling; at this time, as the solvent for the slurry, water, an alcohol such as ethanol, or a mixed solvent composed of water and ethanol can be used; and the wet milling is preferably carried out until the mean particle size of the calcined powder becomes approximately 0.5 to 2.0 µm.

Next, the obtained slurry is dispersed in an organic vehicle. The organic vehicle means a mixture in which a binder is dissolved in an organic solvent. No particular constraint is imposed on the binder used for the organic vehicle; such a binder may be appropriately selected from common various binders such as ethyl cellulose, polyvinyl butyral and acryl. Also, no particular constraint is imposed on the organic solvent used in this case; such a solvent may be appropriately selected from organic solvents such as terpineol, butylcarbitol, acetone, toluene and MEK (methyl ethyl ketone), according to the applied method such as a printing method and a sheet forming method.

When the piezoelectric layer paste is made to take a form of an aqueous coating composition, the calcined powder may be kneaded with an aqueous vehicle in which a water-soluble binder, a dispersant and the like are dissolved in water. No particular constraint is imposed on the water-soluble binder used for the aqueous vehicle; for example, polyvinyl alcohol, cellulose or a water-soluble acrylic resin may be used.

Additionally, an internal electrode paste is prepared (step S106).

The internal electrode paste is prepared by kneading the above-mentioned various conductive materials, or various oxides to be converted by sintering into the above-mentioned conductive materials, organometallic compounds, resinates and the like with the above-mentioned organic vehicle.

In the sintering step to be described below, when Cu is contained as a conductive material in the internal electrode paste, the Cu diffuses into the piezoelectric layers 11 to be formed by sintering of the piezoelectric layer paste.

A terminal electrode paste is also prepared in the same manner as the internal electrode paste (step S107).

In the above-described case, the piezoelectric layer paste, the internal electrode paste and the terminal electrode paste are prepared sequentially in this order; however, needless to say, these pastes may be prepared in parallel with each other or in a reversed order.

No particular constraint is imposed on the content of the organic vehicle in each of the pastes; the content concerned may be such a common value that the content of the binder is approximately 5 to 10% by mass and the content of the solvent is approximately 10 to 50% by mass. Additionally, each of the pastes may contain additives selected from various dispersants, plasticizers, dielectrics, insulators and the like, if needed.

Next, by using the above-described pastes, a green chip (laminate) to be sintered is prepared (step S108).

When the green chip is prepared by means of a printing method, the piezoelectric layer paste is printed two or more times, in a predetermined thickness for each time, for example, on a substrate made of polyethylene terephthalate or the like, to form an outside piezoelectric layer 11a in a green state as shown in FIG. 4. Then, on the outside piezoelectric layer 11a in a green state, the internal electrode paste is printed in a predetermined pattern to form an internal electrode (an internal electrode precursor) 12a in a green state. Then, on the internal electrode 12a in a green state, the piezoelectric layer paste is printed two or more times, in a predetermined thickness for each time, in the same manner as described above, to form a piezoelectric layer (a piezoelectric layer precursor) 11b in a green state. Then, on the piezoelectric layer 11b in a green state, the internal electrode paste is printed in a predetermined pattern, to form an internal electrode 12b in a green state. The internal electrodes 12a and 12b each in a green state are formed so as to be exposed respectively to the different end surfaces facing each other. The above-described operations are repeated predetermined number of times, and finally, on the internal electrode 12 in a green state, the piezoelectric layer paste is printed, in the same manner as described above, predetermined number of times, in a predetermined thickness for each time, to form the outside piezoelectric layer 11c in a green state. Thereafter, the laminate thus obtained is pressurized and bonded under pressure while being heated, and then cut into a predetermined shape to form a green chip (laminate).

In the above-described case, description is made on the preparation of a green chip by means of a printing method; however, such a green chip can also be prepared by means of a sheet forming method.

Next, the green chip is subjected to a binder removal treatment (step S109).

In the binder removal treatment, the atmosphere of the binder removal is needed to be determined according to the conductive material in the internal electrode precursor. When a noble metal is used as a conductive material, the binder removal treatment may be carried out in air, in an atmosphere having an oxygen partial pressure higher than that in air, or in an atmosphere of pure oxygen. However, when Cu or Ni is used as a conductive material, it is required to take oxidation into consideration, so that heating in a low-oxygen reductive atmosphere is to be adopted. On the other hand, it is necessary to consider that an oxide such as PbO contained in the piezoelectric layer precursor is reduced in the binder removal treatment. For example, when Cu is used as the conductive material, it is preferable to set what reductive atmosphere is to be applied to the binder removal treatment on the basis of the equilibrium oxygen partial pressure between Cu and $Cu_2O$ and the equilibrium oxygen partial pressure between Pb and PbO.

The binder removal treatment temperature is set at 300° C. to 650° C., and the binder removal treatment time is needed to be determined according to the temperature and the atmosphere; the binder removal treatment time can be selected to fall within a range from 0.5 to 50 hours. Further, the binder removal treatment may be carried out separately and independently from the sintering, or may be carried out continuously with the sintering. When carried out continuously with the sintering, the binder removal treatment may be carried out in the course of the temperature elevation in sintering.

After the binder removal treatment, the sintering is carried out (step S110).

When Cu is used as the conductive material, the sintering is carried out in a low-oxygen reductive atmosphere. When a noble metal such as a Ag—Pd alloy is used as the conductive material, the sintering may be carried out in air.

In the present invention, the sintering temperature can be set at 800 to 1050° C. When the sintering temperature is lower than 800° C., even with the piezoelectric ceramic composition of the present invention, the sintering does not progress to a sufficient extent. When the sintering temperature exceeds 1050° C., the melting of the conductive material is feared. The sintering temperature is preferably 850 to 1000° C., and more preferably 900 to 950° C. The piezoelectric ceramic composition of the present invention is capable of yielding a sufficiently dense sintered body even when sintered at temperatures of 900 to 950° C.

The low-oxygen reductive atmosphere is preferably such that the oxygen partial pressure is set at $1 \times 10^{-10}$ to $1 \times 10^{-6}$ atm. When the oxygen partial pressure is lower than $1 \times 10^{-10}$ atm, there is a fear that the oxide such as PbO contained in the piezoelectric layer precursors is reduced and deposits as metallic Pb to degrade the piezoelectric properties of the sintered body finally obtained. With the oxygen partial pressure exceeding $1 \times 10^{-6}$ atm, when Cu is used as an electrode material, the oxidation thereof is feared. The oxygen partial pressure is more preferably $1 \times 10^{-8}$ to $1 \times 10^{-7}$ atm.

The laminate 10 prepared by carrying out the above-described steps is subjected to end-face polishing by means of, for example, barrel polishing or sandblast, and then the terminal electrodes 21 and 22 are formed by printing or baking the above-described terminal electrode paste (step S111). It is to be noted that the terminal electrodes 21 and 22 can also be formed by sputtering instead of printing or baking.

In the above described manner, the laminated piezoelectric element 1 shown in FIG. 4 can be obtained.

Example 1

In the present example, effects of Cu and Dy were investigated by adding Cu as the first additive as $Cu_2O$ and Dy as the second additive as $Dy_2O_3$ so as to give the contents shown in Table 1 in relation to the below-described main component. It is to be noted that the third additive was added as described below.

Main component:

$(Pb_{0.965}Sr_{0.03})[(Zn_{1/3}Nb_{2/3})_{0.02}Ti_{0.46}Zr_{0.52}]O_3$

Third additive: $WO_3$, 0.2% by mass

Each of the piezoelectric ceramic composition samples shown in Table 1 was prepared as follows. First, as the raw materials for the main component, a PbO powder, a $SrCO_3$ powder, a ZnO powder, a $Nb_2O_5$ powder, a $TiO_2$ powder and a $ZrO_2$ powder were prepared, and were weighed out so as to give the composition of the above-described main component. Additionally, a $Cu_2O$ powder, a $Dy_2O_3$ powder and a $WO_3$ powder were prepared as the addition species of the first to third additives, respectively, and these powders were added to the base composition of the main component so as to give the contents (first and second additive contents) shown in Table 1 and the third additive content shown above.

Then, these raw materials were wet mixed with a ball mill for 16 hours, and calcined in air at 700 to 900° C. for 2 hours.

The calcined mixture thus obtained was pulverized, and then wet milled with a ball mill for 16 hours. Then, the milled mixture was dried, added with an acrylic resin as a binder, and then granulated. The granulated mixture was compacted into a disc of 17 mm in diameter and 1 mm in thickness with a uniaxial press molding machine under a pressure of approximately 445 MPa.

The compacted bodies thus obtained were sintered in a low-oxygen reductive atmosphere (oxygen partial pressure: $1 \times 10^{-10}$ to $1 \times 10^{-6}$ atm) at 950° C. for 8 hours.

Each of the sintered bodies thus obtained was sliced and lapped to prepare a disc sample of 0.6 mm in thickness so as to have a shape enabling the evaluation of the piezoelectric constant d33. Then, a silver paste was printed on the both sides of the sample thus obtained, and baked at 350° C. The sample was then subjected to a polarization treatment by applying an electric field of 3 kV for 15 minutes in a silicone oil set at 120° C.

Each of the samples thus prepared was subjected to the measurement of the displacement at an applied voltage of 1.7 kV/mm with a laser Doppler displacement gauge to obtain the piezoelectric constant d33. It is to be noted that the piezoelectric constant d33 was based on the strain in the direction perpendicular to the electrode surface (in the thickness direction). The results thus obtained are shown in Table 1.

TABLE 1

| | First additive | | Second additive | | |
|---|---|---|---|---|---|
| | Species | Content (mass %) | Species | Content (mass %) | d33 [pC/N] |
| Comparative Example 1-1 | — | — | — | — | Not evaluable |
| Example 1-1 | $Cu_2O$ | 0.01 | $Dy_2O_3$ | 0.05 | 800 |
| Example 1-2 | $Cu_2O$ | 0.03 | $Dy_2O_3$ | 0.05 | 830 |
| Example 1-3 | $Cu_2O$ | 0.05 | $Dy_2O_3$ | 0.05 | 855 |
| Example 1-4 | $Cu_2O$ | 0.10 | $Dy_2O_3$ | 0.05 | 842 |
| Example 1-5 | $Cu_2O$ | 0.25 | $Dy_2O_3$ | 0.05 | 820 |
| Example 1-6 | $Cu_2O$ | 0.50 | $Dy_2O_3$ | 0.05 | 816 |
| Comparative Example 1-2 | $Cu_2O$ | 1.00 | $Dy_2O_3$ | 0.05 | 744 |
| Comparative Example 1-3 | $Cu_2O$ | 0.05 | $Dy_2O_3$ | 0 | 748 |
| Example 1-7 | $Cu_2O$ | 0.05 | $Dy_2O_3$ | 0.01 | 815 |
| Example 1-8 | $Cu_2O$ | 0.05 | $Dy_2O_3$ | 0.05 | 855 |
| Example 1-9 | $Cu_2O$ | 0.05 | $Dy_2O_3$ | 0.10 | 840 |
| Example 1-10 | $Cu_2O$ | 0.05 | $Dy_2O_3$ | 0.30 | 821 |
| Comparative Example 1-4 | $Cu_2O$ | 0.05 | $Dy_2O_3$ | 0.50 | Not evaluable |

As shown in Table 1, when only the above-described main component was used, cracking was caused in the sample at the time of polarization treatment, so that the piezoelectric constant d33 was not evaluable. On the contrary, the inclusion of the first to third additives made it possible to attain an excellent piezoelectric constant d33 at the high voltage even when sintered at 950° C. However, when the content of the first additive ($Cu_2O$) exceeded 0.5% by mass, the piezoelectric constant d33 was decreased to be 800 pC/N or less. Additionally, although the piezoelectric constant d33 was as low as approximately 750 pC/N without inclusion of the second additive ($Dy_2O_3$), inclusion of Dy yielded the piezoelectric constant d33 values exceeding 800 pC/N.

It is to be noted that the contents of the first to third additives in each of the samples were measured after sintering, and the measured contents were found to be in agreement with the addition amounts. This was also the case for any of the below-described examples.

Example 2

Each of the samples shown in Table 2 was prepared in the same manner as in Example 1 except that the raw materials were prepared so as to give the value of a shown in Table 2 and to include the first to third additives as specified below in relation to the below-described main component. The samples thus obtained were subjected to the measurement of the piezoelectric constant d33 in the same manner as in Example 1. The results thus obtained are shown in Table 2.

As shown in Table 2, with the values of a falling within a range from 0.96 to 1.03, the improvement effect of the piezoelectric properties at high voltages can be enjoyed.

Main component:

$(Pb_{a-0.03}Sr_{0.03})[(Zn_{1/3}Nb_{2/3})_{0.02}Ti_{0.46}Zr_{0.52}]O_3$

First additive: $Cu_2O$, 0.05% by mass
Second additive: $Dy_2O_3$, 0.05% by mass
Third additive: $WO_3$, 0.2% by mass

TABLE 2

|  | Main component composition a | d33 [pC/N] |
|---|---|---|
| Example 2-1 | 0.960 | 827 |
| Example 2-2 | 0.965 | 855 |
| Example 2-3 | 0.995 | 855 |
| Example 2-4 | 1.005 | 822 |
| Example 2-5 | 1.030 | 812 |

Example 3

Each of the samples shown in Table 3 was prepared in the same manner as in Example 1 except that the raw materials were prepared so as to give the value of b shown in Table 3 and to include the first to third additives as specified below in relation to the below-described main component. The samples thus obtained were subjected to the measurement of the piezoelectric constant d33 in the same manner as in Example 1. The results thus obtained are shown in Table 3.

As shown in Table 3, with the values of b falling within a range from 0 to 0.1, the improvement effect of the piezoelectric properties at high voltages can be enjoyed.

Main component:

$(Pb_{0.995-b}Sr_b)[(Zn_{1/3}Nb_{2/3})_{0.02}Ti_{0.46}Zr_{0.52}]O_3$

First additive: $Cu_2O$, 0.05% by mass
Second additive: $Dy_2O_3$, 0.05% by mass
Third additive: $WO_3$, 0.2% by mass

TABLE 3

|  | Main component composition b | d33 [pC/N] |
|---|---|---|
| Example 3-1 | 0.00 | 839 |
| Example 3-2 | 0.01 | 873 |
| Example 3-3 | 0.03 | 855 |
| Example 3-4 | 0.06 | 832 |
| Example 3-5 | 0.10 | 802 |

Example 4

Each of the samples shown in Table 4 was prepared in the same manner as in Example 1 except that the raw materials were prepared so as to specify the element Me as shown in Table 4 and to include the first to third additives as specified below in relation to the below-described main component. The samples thus obtained were subjected to the measurement of the piezoelectric constant d33 in the same manner as in Example 1. The results thus obtained are shown in Table 4.

As shown in Table 4, even with Ca or Ba as the substitutional element for Pb, the improvement effect of the piezoelectric properties at high voltages can be enjoyed, in a similar manner with Sr.

Main component:

$(Pb_{0.965}Me_{0.03})[(Zn_{1/3}Nb_{2/3})_{0.02}Ti_{0.46}Zr_{0.52}]O_3$

First additive: $Cu_2O$, 0.05% by mass
Second additive: $Dy_2O_3$, 0.05% by mass
Third additive: $WO_3$, 0.2% by mass

TABLE 4

|  | Main component composition Me | d33 [pC/N] |
|---|---|---|
| Example 4-1 | Ca | 838 |
| Example 4-2 | Ba | 818 |

Example 5

Each of the samples shown in Table 5 was prepared in the same manner as in Example 1 except that the raw materials were prepared so as to give the values of x, y and z shown in Table 5 and to include the first to third additives as specified below in relation to the below-described main component. The samples thus obtained were subjected to the measurement of the piezoelectric constant d33 in the same manner as in Example 1. The results thus obtained are shown in Table 5.

As clearly seen from Table 5, with the values of x, y and z for the B-site elements respectively falling within the ranges $0.005 \leqq x \leqq 0.047$, $0.42 \leqq y \leqq 0.53$ and $0.45 \leqq z \leqq 0.56$, the improvement effect of the piezoelectric properties at high voltages can be enjoyed.

Main component:

$(Pb_{0.965}Sr_{0.03})[(Zn_{1/3}Nb_{2/3})_xTi_yZr_z]O_3$

First additive: $Cu_2O$, 0.05% by mass
Second additive: $Dy_2O_3$, 0.05% by mass
Third additive: $WO_3$, 0.2% by mass

TABLE 5

|  | Main component composition | | | d33 [pC/N] |
|---|---|---|---|---|
|  | x | y | z |  |
| Comparative Example 5-1 | 0.001 | 0.44 | 0.559 | 733 |
| Example 5-1 | 0.005 | 0.47 | 0.525 | 850 |
| Example 5-2 | 0.01 | 0.47 | 0.520 | 840 |
| Comparative Example 5-2 | 0.02 | 0.38 | 0.60 | 740 |
| Example 5-3 | 0.02 | 0.42 | 0.56 | 810 |
| Example 5-4 | 0.02 | 0.46 | 0.52 | 855 |
| Example 5-5 | 0.02 | 0.53 | 0.45 | 818 |
| Comparative Example 5-3 | 0.02 | 0.57 | 0.41 | 748 |
| Example 5-6 | 0.03 | 0.46 | 0.51 | 810 |
| Example 5-7 | 0.047 | 0.45 | 0.503 | 807 |
| Comparative Example 5-4 | 0.05 | 0.50 | 0.45 | 745 |

Example 6

Each of the samples shown in Table 6 was prepared in the same manner as in Example 1 except that the raw materials were prepared so as to specify the species and content of the third additive as shown in Table 6 and to include the first and second additives as specified below in species and content in relation to the below-described main component. The samples thus obtained were subjected to the measurement of the piezoelectric constant d33 in the same manner as in Example 1. The results thus obtained are shown in Table 6.

As shown in Table 6, the addition of the third additive enables to enjoy the improvement effect of the piezoelectric properties at high voltages.

Main component:

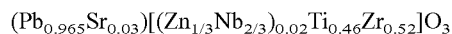

First additive: $Cu_2O$, 0.05% by mass
Second additive: $Dy_2O_3$, 0.05% by mass

TABLE 6

| | Third additive | | |
| | Species | Content (mass %) | d33 [pC/N] |
| --- | --- | --- | --- |
| Comparative Example 6-1 | $Ta_2O_5$ | 0.0 | 705 |
| Example 6-1 | $Ta_2O_5$ | 0.05 | 830 |
| Example 6-2 | $Ta_2O_5$ | 0.2 | 855 |
| Example 6-3 | $Ta_2O_5$ | 0.4 | 849 |
| Example 6-4 | $Ta_2O_5$ | 0.6 | 823 |

Example 7

Each of the samples shown in Table 7 was prepared in the same manner as in Example 1 except that the raw materials were prepared so as to specify the species and contents of the second and third additives as shown in Table 7 and to include the first additive as specified below in species and content in relation to the below-described main component. The samples thus obtained were subjected to the measurement of the piezoelectric constant d33 in the same manner as in Example 1. The results thus obtained are shown in Table 7.

As shown in Table 7, in addition to Dy, as the second additive, Nd, Eu, Gd, Tb, Ho and Er are effective, and in addition to W, as the third additive, Nb, Ta and Sb are also effective.

Main component:

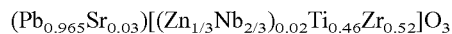

First additive: $Cu_2O$, 0.05% by mass

TABLE 7

| | Second additive | | Third additive | | |
| | Species | Content (mass %) | Species | Content (mass %) | d33 [pC/N] |
| --- | --- | --- | --- | --- | --- |
| Example 7-1 | $Dy_2O_3$ | 0.05 | $Sb_2O_5$ | 0.20 | 863 |
| Example 7-2 | $Dy_2O_3$ | 0.05 | $Nb_2O_5$ | 0.20 | 849 |
| Example 7-3 | $Dy_2O_3$ | 0.05 | $WO_3$ | 0.05 | 832 |
| Example 7-4 | $Dy_2O_3$ | 0.05 | $WO_3$ | 0.10 | 819 |
| Example 7-5 | $Dy_2O_3$ | 0.05 | $WO_3$ | 0.50 | 812 |
| Example 7-6 | $Nd_2O_3$ | 0.05 | $Ta_2O_5$ | 0.20 | 863 |
| Example 7-7 | $Eu_2O_3$ | 0.05 | $Ta_2O_5$ | 0.20 | 839 |
| Example 7-8 | $Gd_2O_3$ | 0.05 | $Ta_2O_5$ | 0.20 | 867 |
| Example 7-9 | $Tb_2O_3$ | 0.05 | $Ta_2O_5$ | 0.20 | 857 |
| Example 7-10 | $Dy_2O_3$ | 0.05 | $Ta_2O_5$ | 0.20 | 855 |
| Example 7-11 | $Ho_2O_3$ | 0.05 | $Ta_2O_5$ | 0.20 | 830 |
| Example 7-12 | $Er_2O_3$ | 0.05 | $Ta_2O_5$ | 0.20 | 826 |

Example 8

In Example 8, an example of the preparation of a laminated piezoelectric element is presented.

At the beginning of the preparation of the laminated piezoelectric element, a piezoelectric layer paste was prepared by preparing a mixture by adding a vehicle to a piezoelectric ceramic composition powder obtained in the same manner as in Example 1-3 of Example 1 except that $Cu_2O$ was not contained in this powder, and by kneading the mixture thus obtained. In parallel, a Cu powder as a conductive material was kneaded with a vehicle to prepare an internal electrode paste. Successively, by using the piezoelectric layer paste and the internal electrode paste, a green chip as a precursor for a laminate was prepared by means of a printing method. The lamination number of the piezoelectric layer paste was set at 300.

Next, the green chip was subjected to a binder removal treatment, and then sintered under reductive sintering conditions to yield a laminated piezoelectric element. The reductive sintering conditions were such that the sintering was carried out in a low-oxygen reductive atmosphere (oxygen partial pressure: $1 \times 10^{-10}$ to $1 \times 10^{-6}$ atm) at a sintering temperature of 950° C. for 8 hours. The laminated piezoelectric element thus obtained was subjected to the measurement of the content of Cu in the piezoelectric layers.

The measurement of the content of Cu was carried out by means of the ICP (Inductively Coupled Plasma) analysis. A preparation method of a sample for ICP was as follows: first, 0.1 g of an analyte sample was added with 1 g of $Li_2B_2O_7$, and the mixture was melted at 1050° C. for 15 minutes; the obtained molten mixture was added with 0.2 g of $(COOH)_2$ and 10 ml of HCl, heated to be dissolved, and then the sample solution volume was adjusted so as to be 100 ml. The ICP measurement was carried out by using ICP-AES (trade name ICPS-8000, manufactured by Shimadzu Corp.).

Consequently, it was found that Cu was contained in the piezoelectric layers in a content of approximately 0.05% by mass in terms of $Cu_2O$. The Cu is recognized to have diffused from the internal electrode paste during the sintering process, because no Cu was contained in the raw materials of the piezoelectric ceramic composition. The laminated piezoelectric element thus obtained was also subjected to the high-temperature accelerated life measurement. The result thus obtained is shown under the heading of "laminate" in Table 8. For the evaluation of the high-temperature accelerated life, the time variation of the insulation resistance was measured by applying voltage to a sample of the laminated piezoelectric element so as for the electric field strength to be 8 kV/mm at 250° C. Here, the high-temperature accelerated life of the sample was measured as the lifetime defined by the elapsed time in which the insulation resistance value of the sample was decreased by one order of magnitude from the reference, namely, the value immediately after the start of the test. For comparison, the sample according to Example 1-3 was also subjected to the same measurement, and the result is shown under the heading of "bulk" in Table 8. As shown in Table 8, the laminate and the bulk sample were equivalent with respect to the piezoelectric constant d33, but the laminate with Cu diffused into the piezoelectric layers thereof was found to be superior to the bulk sample with respect to the high-temperature accelerated life.

TABLE 8

| Form | First additive | Content (mass %) | d33 [pC/N] | High-temperature accelerated life [sec] |
| --- | --- | --- | --- | --- |
| Bulk | $Cu_2O$ | 0.05 (Addition) | 855 | $1.4 \times 10^4$ |
| Laminate | $Cu_2O$ | 0.05 (Diffusion) | 857 | $1.7 \times 10^4$ |

What is claimed is:

1. A piezoelectric ceramic composition comprising:
a composite oxide, as a main component thereof, represented by the following composition formula (1) or (2);

Cu as a first additive, in a content α, in terms of $Cu_2O$, falling within a range $0<\alpha\leq0.5\%$ by mass in relation to said main component;

at least one selected from Dy, Nd, Eu, Gd, Tb, Ho and Er, as a second additive, in a content β, in terms of oxide, falling within a range $0<\beta\leq0.3\%$ by mass, in relation to said main component; and at least one selected from Ta, Nb, W and Sb, as a third additive, in a content γ, in terms of oxide, falling within a range $0<\gamma\leq0.6\%$ by mass in relation to said main component;

wherein:

$$Pb_a[(Zn_{1/3}Nb_{2/3})_xTi_yZr_z]O_3, \quad \text{composition formula (1):}$$

a, x, y and z in the composition formula (1) satisfying the following relations, $0.96\leq a\leq1.03$, $0.005\leq x\leq0.047$, $0.42\leq y\leq0.53$, $0.45\leq z\leq0.56$, and $x+y+z=1$; and $$(Pb_{a-b}Me_b)[(Zn_{1/3}Nb_{2/3})_xTi_yZr_z]O_3, \quad \text{composition formula (2):}$$

a, b, x, y and z in the composition formula (2) satisfying the following relations, $0.96\leq a\leq1.03$, $0<b\leq0.1$, $0.005\leq x\leq0.047$, $0.42\leq y\leq0.53$, $0.45\leq z\leq0.56$, and $x+y+z=1$, and Me in the composition formula (2) representing at least one selected from Sr, Ca and Ba.

2. A laminated piezoelectric element comprising:

a plurality of piezoelectric layers each comprising said piezoelectric ceramic composition according to claim 1; and a plurality of internal electrodes interposed between said piezoelectric layers.

3. The laminated piezoelectric element according to claim 2, wherein:

said internal electrodes comprise Cu; and the Cu as said first additive is due to partial diffusion of the Cu contained in said internal electrodes into said piezoelectric layers.

* * * * *